United States Patent [19]

Torigoe et al.

[11] Patent Number: 4,711,568
[45] Date of Patent: Dec. 8, 1987

[54] EXPOSURE APPARATUS

[75] Inventors: Makoto Torigoe, Kawasaki; Akiyoshi Suzuki, Tokyo; Terumasa Sakai, Hiratsuka, all of Japan

[73] Assignee: Canon Kabushiki Kaisha, Tokyo, Japan

[21] Appl. No.: 836,630

[22] Filed: Mar. 5, 1986

[30] Foreign Application Priority Data

Mar. 6, 1985 [JP] Japan .................................. 60-44206

[51] Int. Cl.⁴ ....................... G03B 27/74; G03B 27/80
[52] U.S. Cl. .................................................... 355/68
[58] Field of Search ............................. 355/53, 68, 69

[56] References Cited

U.S. PATENT DOCUMENTS 4,541,715 9/1985 Akiyama et al. ................. 355/53 X Primary Examiner—Richard A. Wintercorn
Attorney, Agent, or Firm—Fitzpatrick, Cella, Harper & Scinto

[57] ABSTRACT

An exposure apparatus and method for irradiating a mask having a circuit pattern with light emitted from an intermittently emitting type light source so that the mask pattern is photolithographically transferred onto a semiconductor wafer, wherein the output of the intermittent-emission type light source is detected prior to the photolithographic transfer of the mask pattern onto the wafer and, in accordance with the result of such detection, the amount of exposure of the wafer to the light beam from the mask is controlled.

9 Claims, 5 Drawing Figures

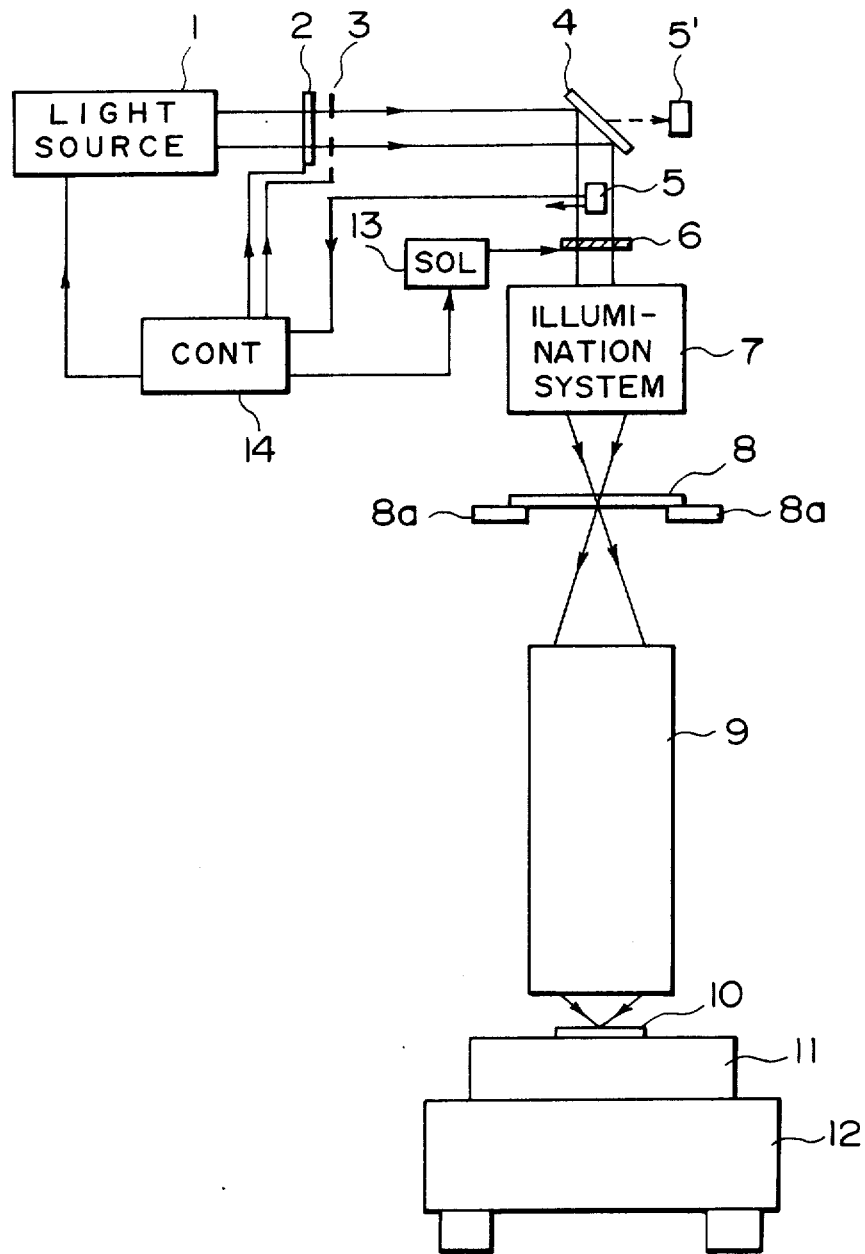
F I G. 1

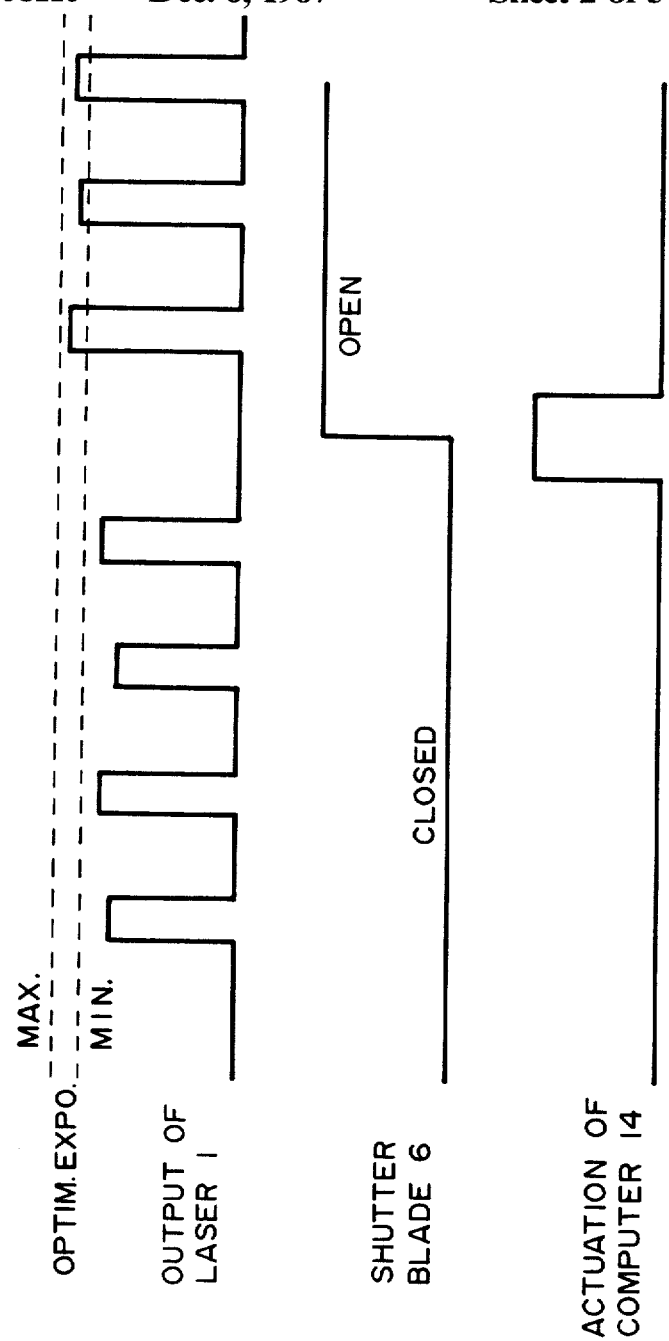

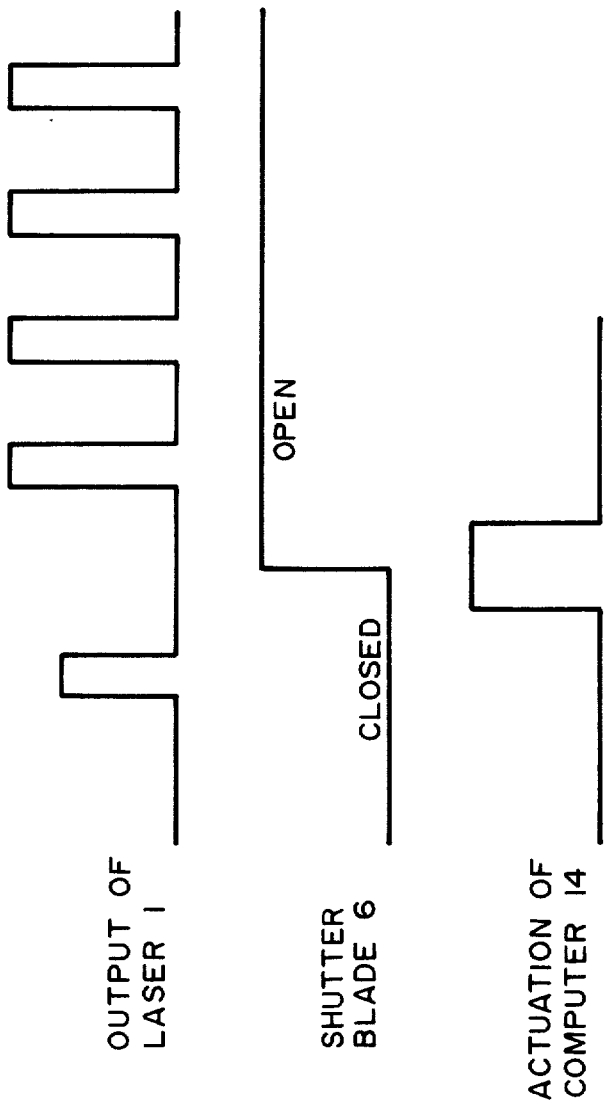

EXPOSURE APPARATUS

FIELD OF THE INVENTION AND RELATED ART

This invention relates to an exposure apparatus and method for use in the manufacture of integrated circuits and the like, for exposing a first object such as a semiconductor wafer or the like to a radiation energy such as light passed through a second object such as a photomask having a specific pattern, thereby to photolithographically transfer the pattern of the second object onto the first object. More particularly, the invention is concerned with such an exposure apparatus and method as described above which is effective to stably assure a correct amount of exposure of the first object, in a case where an intermittently emitting type radiation-energy source is used.

In the field of manufacture of semiconductor devices such as integrated circuits, lithographic techniques capable of forming high-density circuit patterns on a semiconductor wafer become more and more attractive because of the tendency to higher capacities of electronic circuits.

Where a circuit pattern formed on a photomask or reticle is to be transferred onto a semiconductor wafer by way of a projection optical system, the resolution for the minimum width of line of the circuit pattern transferable onto the wafer is usually proportional to the wavelength of light from a light source used. In the case of a contact exposure process or a proximity exposure process wherein the pattern of the mask is transferred onto the wafer while the mask and the wafer are kept in intimate contact with each other, or a minute gap of an order of several microns to several tens of microns is maintained between the mask and the wafer, the resolution power is proportional to the square root of the wavelength used. In view of the above, conventional exposure apparatuses usually employ, as a light source, a super Hg lamp or a Xe-Hg lamp adapted to produce light rays having shorter wavelengths of an order of 200–300 nm in the deep ultraviolet (deep UV) range. Use of such light sources however involves a problem. More specifically, the luminance to be provided by these light sources is not high and the light rays to be produced by these light sources do not show specific directivity. Also, the sensitivity of currently available photoresist materials to be applied to the surface of the wafer is not so high. Therefore, a longer time is required for the "exposure" of the wafer, resulting in a degraded throughput of the exposure apparatus.

Recently, intermittently emitting type light sources such as, for example, an excimer laser (excited dimer laser) have been developed. These types of light sources are capable of providing light rays having a very narrow wavelength range in the deep UV region. Further, many reports have been made landing the effectiveness of the use of such light sources in the lithographic process because of their high luminance, good monochromaticism, superior directivity, etc.

In many types of excimer lasers which are commercially available at present, a mixture of gases for laser emission is sealingly contained in a gas chamber. The gas mixture is circulated and, after its use, it is discharged. As for such gas mixture, halogen gases having high corrosiveness, such as $F_2$, HCl, etc. are used. Because of the high corrosiveness of the halogen gas used, there occurs a reaction of the same with an internal wall of a laser discharging tube or an electrode for charge emission. Such reaction is accelerated by the charge-emission during energization of the laser device. Due to such reaction of the halogen gas, impurities are produced, which causes degradation of the laser power over time. The reaction of the halogen molecules is not interrupted even when the laser beam is not emitted. So, if the laser beam is to be emitted from the laser device after the device is kept inoperative for a long period of time, it is difficult to foresee the laser power to be outputted, because the condition for laser emission is not the same as that established for the energy of the laser beam last produced.

This leads to a problem in the use of an intermittent-emission type light source, such as the excimer laser, as the radiation energy source in the semiconductor device manufacturing exposure apparatus, since in such apparatus it is necessary to precisely control the amount of exposure of the semiconductor wafer in order to meet miniaturization of the circuit pattern.

SUMMARY OF THE INVENTION

It is accordingly a primary object of the present invention to provide an exposure apparatus for use in the manufacture of semiconductor devices or the like, in which apparatus the amount of the exposure of the semiconductor wafers can always be controlled precisely regardless of use of an intermittent-emission type light source such as a ultraviolet laser.

It is another object of the present invention to provide an exposure apparatus for use in the manufacture of semiconductor devices or the like, which apparatus is adapted to attain a correct amount of exposure of the semiconductor wafers even after the apparatus is kept inoperative for a long period of time, thereby to stably allow manufacture of semiconductor devices having fine circuit patterns.

Briefly, according to one aspect of the present invention, there is provided an exposure apparatus and method for irradiating a mask having a circuit pattern with light emitted from an intermittently emitting type light source so that the mask pattern is photolithographically transferred onto a semiconductor wafer, wherein the output of the intermittent-emission type light source is detected prior to the photolithographic transfer of the mask pattern onto the wafer and, in accordance with the result of the detection, the amount of exposure of the wafer to the light from the mask is controlled.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of an exposure apparatus according to an embodiment of the present invention.

FIGS. 2A and 2B are timing charts for explaining, respectively, examples of the manner of controlling the amount of laser-beam emission in the exposure apparatus according to the FIG. 1 embodiment.

DESCRIPTION OF THE PREFERRED EMBODIMENTS

Figure 3:
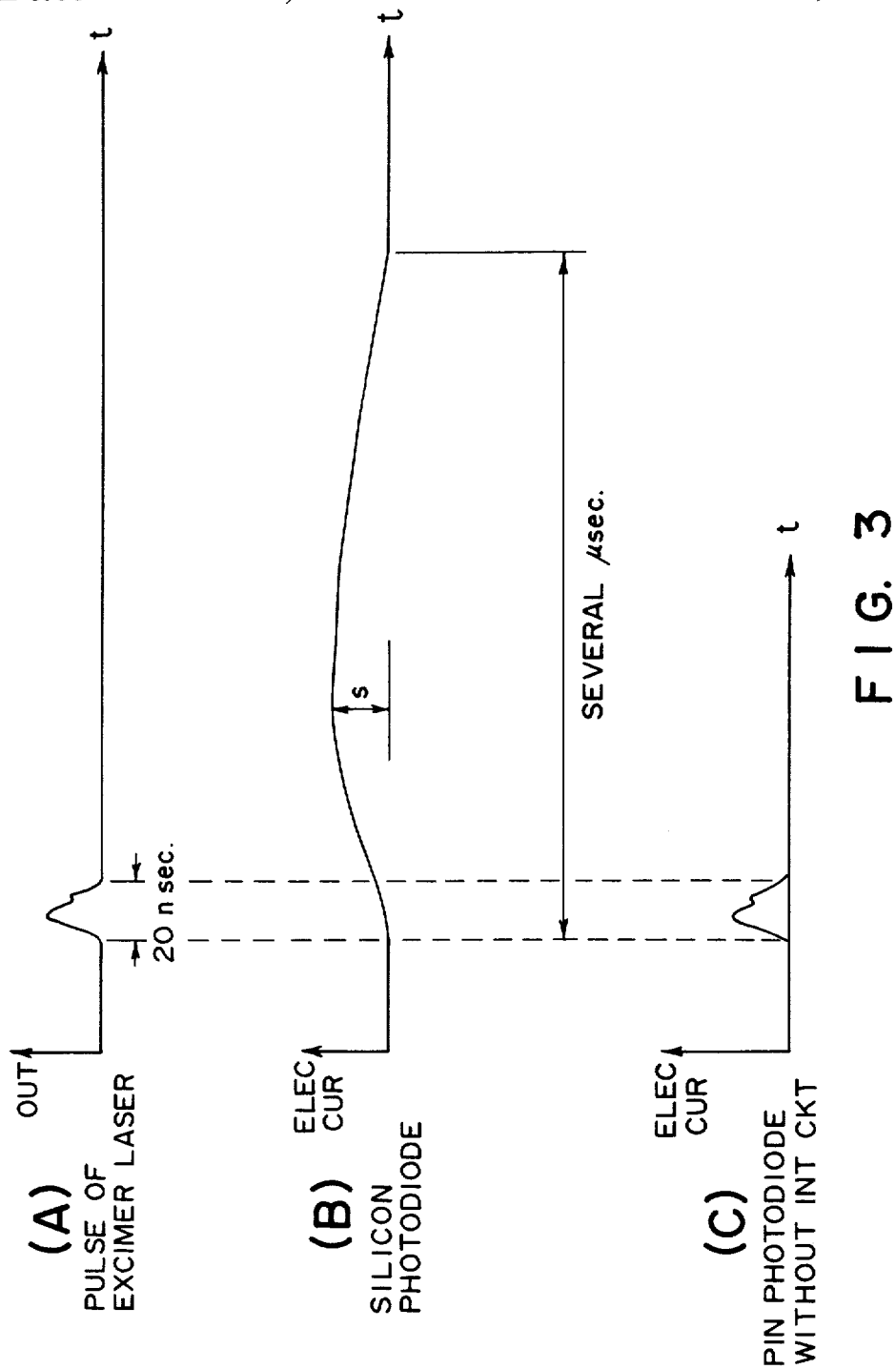
FIG. 3 is a graph schematically showing the detection of a pulse of a laser beam from an excimer laser used in an exposure apparatus according to the FIG. 1 embodiment.

Referring first to FIG. 1, there is shown an exposure apparatus according to one embodiment of the present invention, which apparatus is adapted to photolithographically transfer a circuit pattern of a mask onto a semiconductor wafer for the manufacture of semiconductor devices.

In FIG. 1, the apparatus includes an intermittently emitting type light source 1 which comprises, in this embodiment, an excimer laser adapted to produce pulses of laser beam in the deep UV region. The apparatus further includes a neutral-density (ND) filter 2 of known type having stepwise-variable optical density, a variable aperture member 3 of known type having an aperture of variable diameter, a reflection mirror 4, and a detector 5 disposed in the path of the light from the light source 1, for detecting reflected quantity of the light. The detector 5 comprises a photoelectric converting element preferably formed by a silicon photodiode. The apparatus further includes a shutter element 6, an illumination system 7 for irradiating a reticle or mask 8 with the light beam supplied from the excimer laser 1, a holder 8a for holding and moving the mask 8, a projection system 9 for projecting a circuit pattern of the mask 8 onto a wafer 10. The wafer 10 is carried on an X-Y stage 11 which is movable in two orthogonal directions by means of an unshown driving unit. The X-Y stage 11 is supported by a surface plate 12. The apparatus further includes a solenoid 13 for actuating the shutter 6, and a control unit 14 for controlling the optical density of the ND filter 2, the aperture diameter of the aperture member 3 and the laser output power of the light source 1.

While not shown in the drawing, the apparatus of the present embodiment is provided with an alignment optical system for detecting and adjusting the positional relation between the mask 8 and the wafer 10.

In operation, the shutter element 6 is first set at its closed position and one or more pulses of laser beam are outputted from the excimer laser 1. The output energy of the pulsed laser beam is detected by the detector 5. Further, an output signal of the detector 5, representing the output energy of the pulsed laser beam, is supplied to the control unit 14. In this manner, any deterioration of the gas mixture contained in the excimer laser 1 can be detected. Then, in accordance with the output signal of the detector 5, the control unit 14 operates to control the quantity of light to be directed toward the mask 8 surface. More particularly, the control unit 14 controls the quantity of light to the mask 8, by actuating an unshown voltage adjusting means which is adapted to change the discharging voltage of the excimer laser 1, by changing the optical density of the ND filter 2 or by changing the aperture diameter of the aperture member 3. Alternatively, the voltage adjusting means, the ND filter 2 and the aperture member 3 may be actuated at the same time to cooperate and control the quantity of light to the mask 8.

Upon completion of the adjustment to the light quantity or, alternatively, after a predetermined quantity of light is detected by the detector 5, the detector 5 is moved out of the path of light as shown by an arrow in FIG. 1 and the solenoid 13 is operated to open the shutter element 6, thereby to allow passage of the light to the illumination system 7. In this manner, the pulsed laser beam from the light source 1, now having an appropriate quantity, is allowed to illuminate the mask 8 surface, such that the pattern of the mask 8 is projected by the projection system 9 onto the wafer 10. As a result, the wafer 10 is exposed to the correct amount of light and, whereby the mask pattern is photolithographically transferred onto the wafer 10 with a correct amount of exposure.

In this embodiment, each of the ND filter 2, the detector 5, the shutter element 6, etc. may be disposed at any position on the optical path from the excimer laser 1 to the wafer 10. Further, the detector 5 may be disposed behind the mirror 4, such as depicted by numeral 5' in FIG. 1, if the mirror 4 is replaced by a half mirror. In such case, the quantity of light to be directed to the mask 8 surface can be detected or monitored even during the exposure of the wafer 10 to the light passed through the mask 8.

Also in this embodiment, the shutter element 6 may be omitted. In such case, however, the wafer 10 is taken off the X-Y stage 11 during the time period which one or more pulses of laser beam are outputted from the excimer laser 1 for the preparatory detection of any deterioration of the gas mixture in the excimer laser 1.

Where an excimer laser is used as a light source, as in the present embodiment, and when the photolithographic transfer of the circuit pattern of the mask 8 to the wafer 10 is repeated in a known die-by-die exposure manner, it is possible to continuously move the X-Y stage 11 so as to sequentially transfer the circuit pattern of the mask 8 onto discrete regions (shot areas) of the wafer 10. This is because the pulse time of the excimer laser (i.e. the duration of emission of one pulse from the excimer laser) is very short, such as of an order of 10–20 nsec. Where the X-Y stage is moved continuously while effecting the photolithographic transfer sequentially, and if each of the exposures of the discrete areas on the wafer is effected by using one pulse from the excimer laser 1, the throughput of the exposure apparatus can be improved very easily and significantly.

While, in the foregoing, the invention has been described with reference to an embodiment wherein the circuit pattern of the mask is transferred onto the wafer by projection exposure using a projection optical system, the invention is applicable also to an exposure apparatus of "contact exposure type" or "proximity exposure type" wherein the mask and the wafer are kept in contact, or wherein a minute gap of an order of a few microns to several tens of microns is maintained between the mask and the wafer.

Further, the excimer laser which has been described as an example of an intermittent-emission type light source may be replaced by a solid laser device using slab glass.

Referring now to the timing charts of FIGS. 2A and 2B, the sequence of control of the quantity of light to be directed to the mask 8 surface will be described in more detail.

FIG. 2A shows an example. In the case of FIG. 2A, a plurality of pulses of the laser beam are outputted from the excimer laser 1 for the preparatory detection of the quantity of light to be supplied to the mask and, therefore, to the wafer. In the example of FIG. 2A, four pulses are outputted from the excimer laser 1 when an electric power is initially supplied to the exposure apparatus after the same has been kept inoperative for a long period of time. The shutter blade 6 is maintaned at its closed position until the four pulses are outputted from the excimer laser 1. Each of the output energies of the pulses of the laser beam from the excimer laser 1 is detected by the detector 5, and an average of the output energies of the four laser beam pulses is calculated by a computer included in the control unit 14. In accordance with the average obtained by the calculation, the laser power of the excimer laser 1 is adjusted by the control unit 14 in the manner described hereinbefore, such that a fifth pulse of the laser beam, now having a proper quantity of energy, is outputted from the excimer laser 1. The shutter blade 6 is opened after the emission of the fourth pulse and before the emission of the fifth pulse, so that the exposure of the wafer is initiated at the time of the emission of the fifth pulse of the laser beam, as will be understood from FIG. 2A.

FIG. 2B shows another example. In the case of FIG. 2B, only one pulse of the laser beam is outputted from the excimer laser 1 for the preparatory detection of the quantity of light to be supplied to the wafer. Thus, in the FIG. 2B case, the adjustment of the laser power is accomplished on the basis of the output energy of one pulse from the excimer laser 1, not an average of plural pulses.

Referring now to FIG. 3, details of the detector 5 for detecting the quantity of light will be described.

The detector 5 used in this embodiment preferably comprises a silicon photodiode, as described hereinbefore. It is preferable to use a silicon photodiode because of the following reason:

Where a pulse of the excimer laser beam has a shape such as shown in an upper part (A) in FIG. 3 and if a detector element having a high response speed, such as for example a PIN (Positive Intrinsic Negative) photodiode, is used as the detector 5, then the detector element will produce an output current of a shape as shown in a lower part (C) in FIG. 3. It is seen from this Figure that the shape of the output current from the detector element substantially corresponds to that of the pulse of the excimer laser beam. This is because of the high response speed of the detector element. So, if the pulses of the laser beam from the excimer laser maintain the same, stable shape (which means that the pulse height and the pulse width are substantially constant), then the wave height of an output current from the detector element can be regarded as representing the energy of the laser-beam pulse being detected, since the former is substantially proportional to the latter.

Actually, however, the outputs of the excimer laser usually include significant fluctuation or variation. Therefore, in order to obtain a specific value which corresponds to or is proportional to the energy of the laser-beam pulse (i.e. the quantity of light), it is necessary to use an integrating circuit for integrating each of the outputs of the detector element.

As compared therewith, if a silicon photodiode whose response speed is not so high is used, then it will produce an output current of a shape as shown in a middle part (B) of FIG. 3 upon reception of the laser-beam pulse of the upper part (A) in FIG. 3. Because of the relatively low response speed, a function of silicon photodiode is to produce an "integrating effect". Thus, the peak "s" of the output wave from the silicon photodiode is substantially proportional to the energy or the quantity of light of the laser-beam pulse (A) in FIG. 3. For this reason, the output energy of the laser-beam pulse can be accurately measured without use of any integrating circuit, by merely detecting the peak "s" of the output current of the silicon photodiode.

Figure 4:
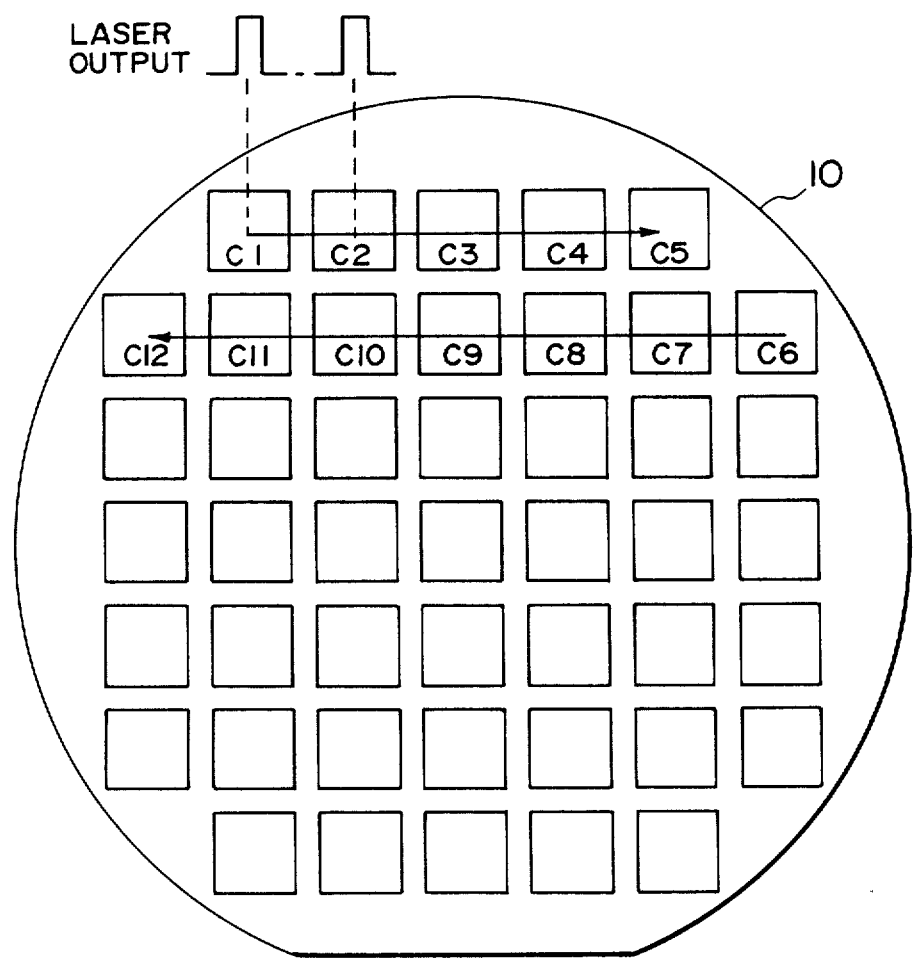
FIG. 4 is a schematic view showing the timing of the laser-beam emission for the manufacture of semiconductor devices, in accordance with one aspect of the present invention.

FIG. 4 shows an example of the manner of repetition of the photolithographic transfer of the mask pattern to the discrete areas on the wafer. In the case of FIG. 4, one pulse is emitted from the excimer laser 1 each time one of the discrete areas (shot areas) on the wafer 10 is positioned at the exposure station (the position under the projection system 9), while the wafer 10 is moved continuously by the X-Y stage 11.

More particularly, when a first shot area C1 on the wafer 10 reaches the exposure station, one pulse of the laser beam is emitted from the excimer laser 1, whereby the circuit pattern of the mask 8 is projected by the projection system 9 onto the first shot area C1 and, thereby, the mask pattern is photolithographically transferred onto the first shot area C1. The preparatory adjustment of the laser power has been completed in the manner as described hereinbefore before the pattern transfer relative to the first shot area C1 is effected.

Subsequently, the wafer 10 is moved so that a second shot area C2 of the wafer reaches the exposure station. At this time, a second pulse of the laser beam is emitted from the excimer laser 1, whereby the mask pattern is photolithographically transferred onto the same shot area. During movement of the wafer 10 for placing the second shot area C2 at the exposure station, the emission of the excimer laser is interrupted. During the pattern transfer onto the second shot area C2, on the other hand, the movement of the wafer 10 is not interrupted but continued. Thus, the circuit pattern of the mask 8 is transferred onto the second shot area C2 while the wafer 10 is being moved.

In this manner, the remaining shot areas C3–C5 in one row are subjected to the pattern transfer operation in the named order, while the movement of the wafer 10 is continuous. Upon completion of the exposure of the shot area C5, the wafer 10 is moved in X and Y directions in order to prepare for the pattern transfer relative to the shot areas in the next row, i.e. the shot area C6–C12. Thus, the circuit pattern of the mask is transferred onto each of the shot areas C6–C12 in this order, while the wafer 10 is moved continuously. The adjustment of the laser power as described hereinbefore may of course be effected after completion of exposure of the shot area C5 and prior to the exposure of the shot area C6.

In this manner, photolithographic pattern transfer relative to each of the discrete areas on the wafer 10 is repeated, until the last shot area in the last row is subjected to the pattern transfer operation. Such "scanning" exposure, in which the pattern transfer is sequentially effected relative to the discrete areas on the wafer while the wafer 10 is moved in a scanning motion, is very effective to increase the throughput of the apparatus because it eliminates the necessity of interrupting the movement of the wafer for the exposure of each shot area.

While, in the FIG. 4 example, the pattern transfer to each shot area of the wafer is effected by use of one pulse of the laser beam, two or more pulses may be used for the photolithographic pattern transfer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for exposing a first object to light passed through a second object having a pattern to transfer the pattern of the second object onto the first object, said apparatus comprising:
   an intermittently emitting type light source for intermittently emitting a pulse of light to intermittently irradiate the second object with the pulse of light;
   first means operative on said light source to cause the same to emit one or more pulses of light for the detection of the quantity of light from said light source;
   means for detecting the quantity of light of said one or more pulses from said light source; and
   second means responsive to said detecting means to adjust the quantity of light to be incident on the first object, in accordance with the detection by said detecting means.

2. An apparatus according to claim 1, wherein said second means comprises at lest one of adjusting means for changing the output of said light source, filter means disposed in a path of light from said light source and aperture means having a variable-diameter aperture and disposed in the path of light from said light source.

3. An apparatus according to claim 1, wherein said light source is arranged to emit one pulse of light to transfer the pattern of the second object onto the first object.

4. An apparatus according to claim 1, wherein exposure of the first object to the pulse of light from said light source during the detection by said detecting means is prevented.

5. An apparatus according to claim 1, wherein said detecting means is displaceable to a position at which said detecting means does not interfere with the transfer of the pattern of the second object onto the first object.

6. An apparatus according to claim 1, wherein said light source comprises an ultraviolet laser device.

7. An exposure apparatus for exposing a first object to light passed through a second object having a pattern to transfer the pattern of the second object onto the first object, said apparatus comprising:
   an intermittently emitting type light source for intermittently emitting a light beam to intermittently irradiate the second object with the light beam;
   means for detecting the quantity of the light beam from said light source, said detecting means including a silicon photodiode adapted to produce an output having a peak which is substantially proportional to the quantity of light beam from said light source; and
   means for controlling the irradiation of the second object with the light beam from said light source in accordance with the output of said detecting means.

8. An exposure apparatus for exposing a first object to light passed through a second object having a pattern to transfer the pattern of the second object onto the first object, said apparatus comprising:
   an intermittently emitting type light source for intermittently emitting a light beam to intermittently irradiate the second object with the light beam, wherein said light source comprises an ultraviolet laser device; and
   means for detecting the quantity of the light beam from said light source, said detecting means including a silicon photodiode adapted to produce an output having a peak which is substantially proportional to the quantity of light beam from said light source.

9. An exposure appartus for exposing a first object to light passed through a second object having a pattern to transfer the pattern of the second object onto the first object, said apparatus comprising:
   an intermittently emitting type light source for intermittently emitting a light beam to intermittently irradiate the second object with the light beam; and
   means for detecting the quantity of the light beam from said light source, said detecting means including a silicon photodiode adapted to produce an output having a peak which is substantially proportional to the quantity of light beam from said light source, and wherein said detecting means detects the quantity of light beam from said light source prior to the transfer of the pattern of the first object onto the second object.

* * * * *

UNITED STATES PATENT AND TRADEMARK OFFICE
CERTIFICATE OF CORRECTION

PATENT NO. : 4,711,568            Page 1 of 2

DATED : December 8, 1987

INVENTOR(S) : MAKOTO TORIGOE, ET AL.

It is certified that error appears in the above-identified patent and that said Letters Patent is hereby corrected as shown below:

AT [30] IN THE FOREIGN APPLICATION PRIORITY DATA

Insert --Jan. 29, 1986 [JP] Japan ..... 61-17072--.

COLUMN 1

Line 57, "landing" should read --lauding--.

COLUMN 2

Line 29, "of use" should read --of the use--.
    Line 30, "a" should read --an--.

COLUMN 3

Line 19, "having stepwise-variable" should read --having a stepwise-variable--.
    Line 23, "reflected quantity of the" should read --the quantity of reflected--.

COLUMN 5

Line 1, "maintaned" should read --maintained--.
    Line 62, "of silicon" should read --of the silicon--.

COLUMN 6

Line 40, "area" should read --areas--.

UNITED STATES PATENT AND TRADEMARK OFFICE
CERTIFICATE OF CORRECTION

PATENT NO. : 4,711,568

DATED : December 8, 1987

INVENTOR(S) : MAKOTO TORIGOE, ET AL.

It is certified that error appears in the above-identified patent and that said Letters Patent is hereby corrected as shown below:

COLUMN 8

Line 29, "appartus" should read --apparatus--.

Signed and Sealed this

Fifth Day of July, 1988

Attest:

DONALD J. QUIGG

Attesting Officer

Commissioner of Patents and Trademarks